United States Patent [19]
Flesner et al.

[11] Patent Number: 5,196,690
[45] Date of Patent: Mar. 23, 1993

[54] OPTICALLY POWERED PHOTOMULTIPLIER TUBE

[75] Inventors: Larry D. Flesner, San Diego; Stephen A. Miller, Upland; Wadad B. Dubbelday, Spring Valley, all of Calif.

[73] Assignee: The United States of America as represented by the Secretary of the Navy, Washington, D.C.

[21] Appl. No.: 721,844

[22] Filed: Jun. 18, 1991

[51] Int. Cl.⁵ .............................................. H01J 40/14
[52] U.S. Cl. .................................. 250/207; 250/551; 313/536
[58] Field of Search ................ 250/207, 213 VT, 551; 313/534, 535, 536

[56] References Cited

U.S. PATENT DOCUMENTS

| | | | |
|---|---|---|---|
| 3,280,333 | 10/1966 | Hyman et al. | 250/212 |
| 3,614,436 | 10/1971 | Hasegawa et al. | 250/207 |
| 3,614,646 | 10/1971 | Hansen | 250/207 |
| 3,714,441 | 1/1973 | Kreda | 250/207 |
| 3,948,682 | 4/1976 | Bordina et al. | 136/89 |
| 4,433,236 | 2/1984 | Shimada | 250/213 |
| 4,465,927 | 8/1984 | Scholz et al. | 250/213 |
| 4,695,120 | 9/1987 | Holder | 350/96.11 |
| 4,963,113 | 10/1990 | Muramatsu | 445/58 |

OTHER PUBLICATIONS

Hitoshi Sekita et al, High Voltage Power Supply with Integrated Photovoltaic Cell Array, pp. 173–179, Pesc '88 Record (Apr. 1988).

Primary Examiner—David C. Nelms
Assistant Examiner—K. Shami
Attorney, Agent, or Firm—Harvey Fendelman; Thomas Glenn Keough; Michael A. Kagan

[57] ABSTRACT

An optically powered photomultiplier tube is provided, comprising a vacuum chamber having a window for incident optical radiation which is to be detected; a photocathode to receive the optical radiation; an electron multiplier system within the chamber to amplify the electron current from the photocathode; an anode to receive the amplified electron current; a high voltage photocell array positioned within the chamber for generating high voltage electrical power that is provided to the electron multiplier system; a system for delivering optical power to the photocell array; a first electrical contact penetrating the container in a vacuum tight manner and operably coupled to the anode; and a second electrical contact penetrating the container in a vacuum tight manner and operably coupled to the photocell array.

13 Claims, 11 Drawing Sheets

OPTICALLY POWERED PHOTOMULTIPLIER TUBE

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to the field of photomultiplier tubes, and more specifically to an optically powered photomultiplier tube.

Photomultiplier tubes are sensitive optical detection devices which are used for spectroscopy, pollution monitoring, scintillation detectors, and other applications requiring high sensitivity light detection.

A photomultiplier tube is a vacuum tube device that includes a photocathode which receives incident optical radiation and emits electrons. A photomultiplier tube also has stages of electrodes, or dynodes, that are biased so that electrons from the stages are serially accelerated to energies of 100 to 10,000 electron volts prior to impact on any given dynode stage. An anode collects the electrons which are emitted and multiplied in the photomultipier tube and conducted by a feedthrough out of the vacuum tube. A separate high voltage potential is required for the photocathode and for each dynode. The anode is typically at or near ground potential.

A major difficulty in using photomultiplier tubes pertains to high voltage potentials which must be provided to the dynodes. One approach uses a single high voltage supply and a series of resistors to divide the supply voltage to the separate voltage levels required for each dynode stage. This is an inconvenient solution because power is wasted. Use of a separated high voltage supply to each dynode is another way, but this requires several high voltage leads from the power supply to the photomultiplier tube. Another problem with these methods is that any current leakage from the high voltage contacts to the anode signal output may interfere with signal detection. Another difficulty with photomultiplier tubes is that several electrodes must pass through the body of the vacuum tube, providing opportunity for leakage currents. Further, the high voltage cables necessary to provide power to a conventional photomultiplier tube are sometimes inconvenient to route from a power supply to the location where it is desired to use the photomultiplier tube. Therefore, there is a need for a photomultiplier tube which does not require an external high voltage power source.

SUMMARY OF THE INVENTION

The present invention overcomes the shortcomings of conventional photomultiplier detector tubes by providing an optically powered photomultiplier detector, comprising a vacuum chamber having a window for incident optical radiation which is to be detected; a photocathode to receive the optical radiation; an electron multiplier system within the chamber to amplify the electron current from the photocathode; an anode to receive the amplified electron current; a high voltage photocell array positioned within the chamber for generating high voltage electrical power to the electron multiplier system; means for delivering optical power to the photocell array; a first electrical contact penetrating the container in a vacuum tight manner and operably coupled to the anode; and a second electrical contact penetrating the container in a vacuum tight manner and operably coupled to the photocell array.

An important advantage to the present invention is that the dynodes are optically powered, thus obviating the need for external high voltage connections. This permits compact, flexible, and safe power connection to the invention. These features provide the present invention the advantages of simplified fabrication and operation.

DESCRIPTION OF THE PREFERRED EMBODIMENT

Figure 1A:
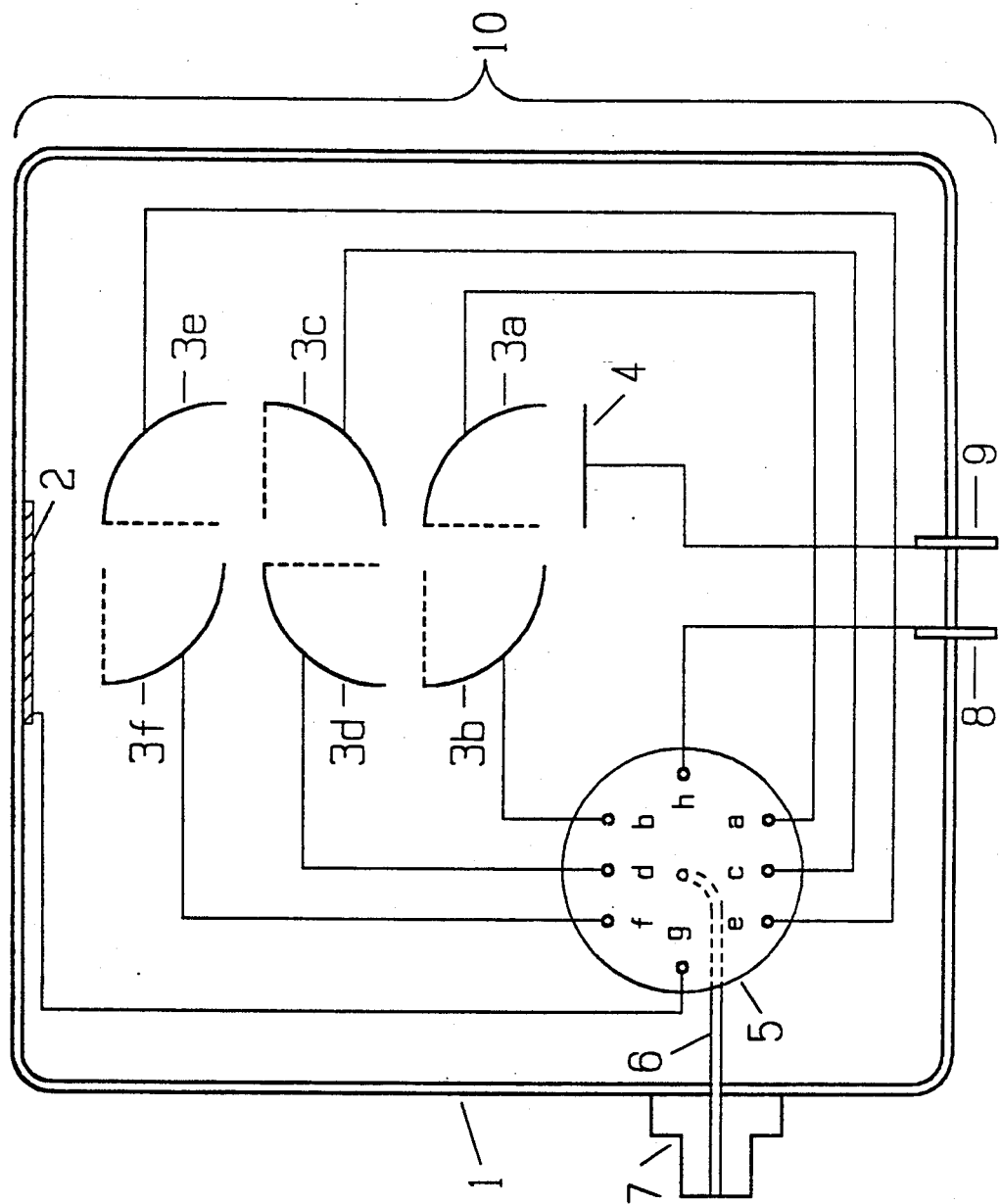
FIG. 1a is a schematic diagram of one embodiment of the photomultiplier tube of the present invention.

Referring to FIG. 1a, photomultiplier detector 10 includes a photomultiplier tube consisting of an evacuated enclosure 1, a photo-electron emitting cathode 2, electron multiplier elements (dynodes) 3a-3f, electron collecting anode 4, and vacuum sealed electrical feedthroughs 8 and 9 for output of an electrical signal. In the invention disclosed herein, electrical bias for dynodes 3a-3f is supplied internally by the optically powered high voltage supply enclosed in package 5. Optical power is transmitted into package 5 by optical fiber 6. Optical fiber 6 penetrates vacuum chamber 1 through fitting 7 which may be configured to receive a mating fitting, not shown, in order to operably couple optical fiber 6 to a source of optical power. The optical power source may include another optical fiber coupled to a light generator such as a laser diode. The combination of fitting 7, optical fiber 6, and chamber 1 provide a vacuum seal between the interior and exterior of vacuum chamber 1, and except for the interior of package 5, prevents light from reaching the interior of vacuum chamber 1. Such optical fiber couplers are well known to those skilled in the art of light transmission by optical fibers. Many methods for generating and coupling optical power into optical fibers are well known. One common method is to focus light from a laser diode into an optical fiber. Vacuum sealing methods for optical fiber feedthroughs is also a well known art. As will be explained below, the optical power conveyed by fiber 6 is converted into high voltage electrical power by electronic circuits contained in package 5. The high voltage electrical power is connected to photocathode 2 and to dynodes 3a-3f via output pins a-g as diagrammed in FIG. 1a. Output pin $h$ is the ground or common output which is connected to electrical feedthrough 8.

Dynodes 3a–3f are represented as "box and grid" type dynodes. Other types of multiplier elements such as the "circular cage" type, the "linear focused" type, the "venetian blind" type, the "proximity mesh" type, and the "microchannel plate" type may also be used in the present invention by conjoining them with an internal optically powered high voltage power supply as described further herein. Although the number of electron multiplier elements shown in FIG. 1a is six, it is to be understood that the scope of the invention includes employment of any other number of electron multiplier elements required for a particular application. Manufacturers such as Burle and Hamamatsu supply a variety of photomultiplier tubes that may be suitably adapted to the present invention.

As is well known to those skilled in the design and operation of photomultiplier tubes, photomultiplier tubes may also include electron focusing electrodes which require electrical bias. Although such elements are not shown in FIG. 1a, an optically energized power supply, such as included in package 5, can also provide electrical bias to any other elements of photomultiplier 10 requiring electrical power.

An optical fiber is one method for conveying optical power to package 5 in photomultiplier tube 10. Other schemes for conveying optical power to package 5 may employ a bundle of optical fibers, a light pipe tube, and an additional incident window in vacuum chamber 1. Furthermore, as explained further herein, a light generator, such as a laser diode or light emitting diode, may be mounted within package 5, thus obviating the necessity for an optical link between the exterior and interior of vacuum chamber 1.

Figure 2A:
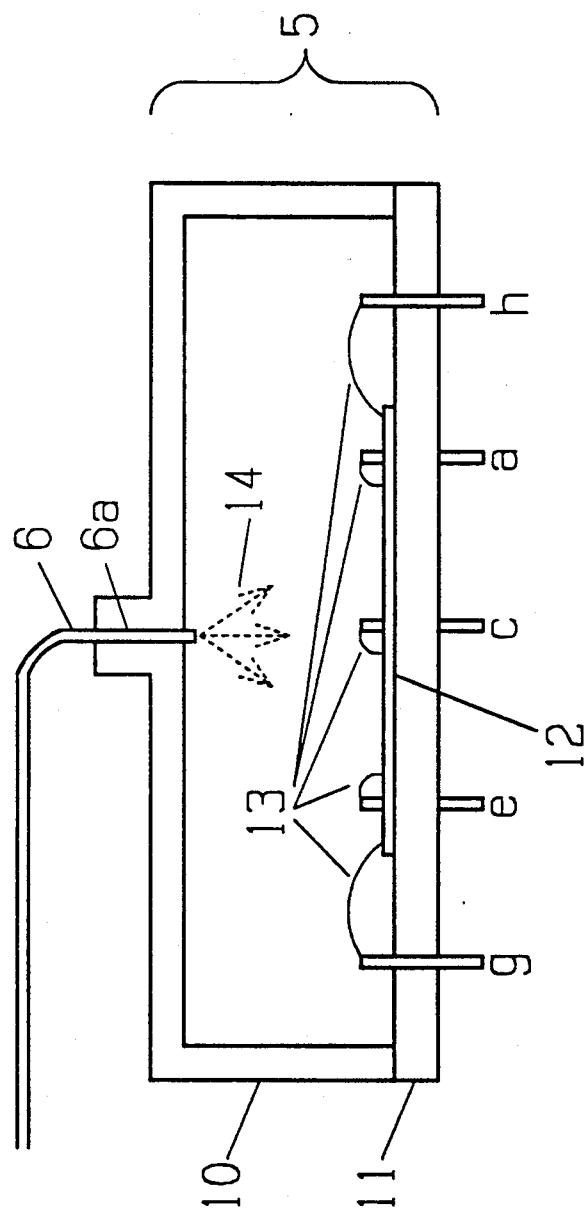
FIG. 2a is a cross-section side view through pins $g$ and $h$ of one embodiment of the optically powered high voltage power supply.
Figure 3:
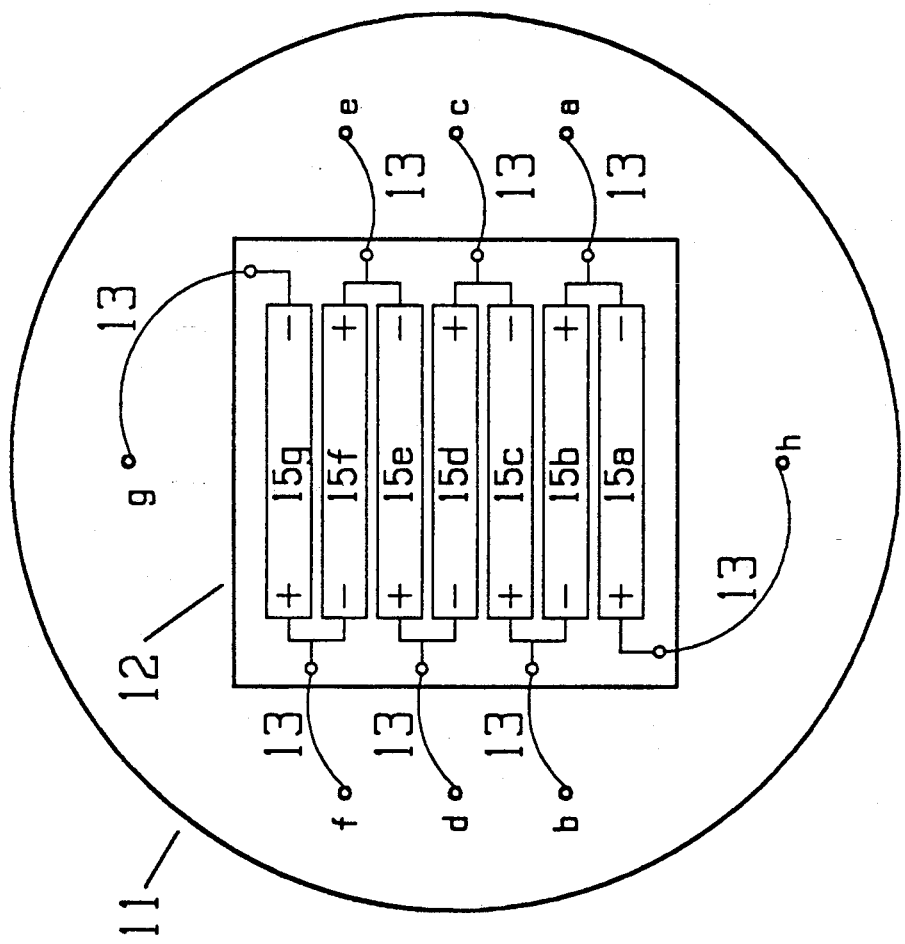
FIG. 3 is a top view of the package base with package cover removed.

Referring to FIGS. 2a and 3, collectively, package 5 includes base 11 and cover 10. Base 11 and cover 10 are joined together to form a light-tight assembly. Optical fiber 6 is introduced into package 5 by a light-tight feedthrough 6a. Optical power 14 is emitted from fiber 6 and illuminates photocell circuits 15a–15g fabricated on substrate 12. An example of a method for fabricating photocell circuits suitable for use in the present invention is described below. High voltage power, generated by conversion of optical power to electrical power, is connected to insulated electrical feedthroughs a–h by bonding wires 13.

It should be noted that since a photomultiplier tube is a very sensitive light detector, it is necessary that the optical power which energizes the electrical power supply be prevented from reaching photocathode 2. This is done by making package 5 fully opaque, and ensuring that optical fiber 6 and all other optical power delivery elements are also surrounded by opaque material. Fiber 6 includes one or more exterior layers, not shown, which prevent optical leakage.

Alternatives to illuminating substrate 12 from above, as illustrated in FIG. 1a, include any general geometry for coupling optical power from optical fiber 6 to the circuits on substrate 12. Examples include conjoining fiber 6 to the edge of substrate 12, or illuminating substrate 12 from below.

Figure 1B:
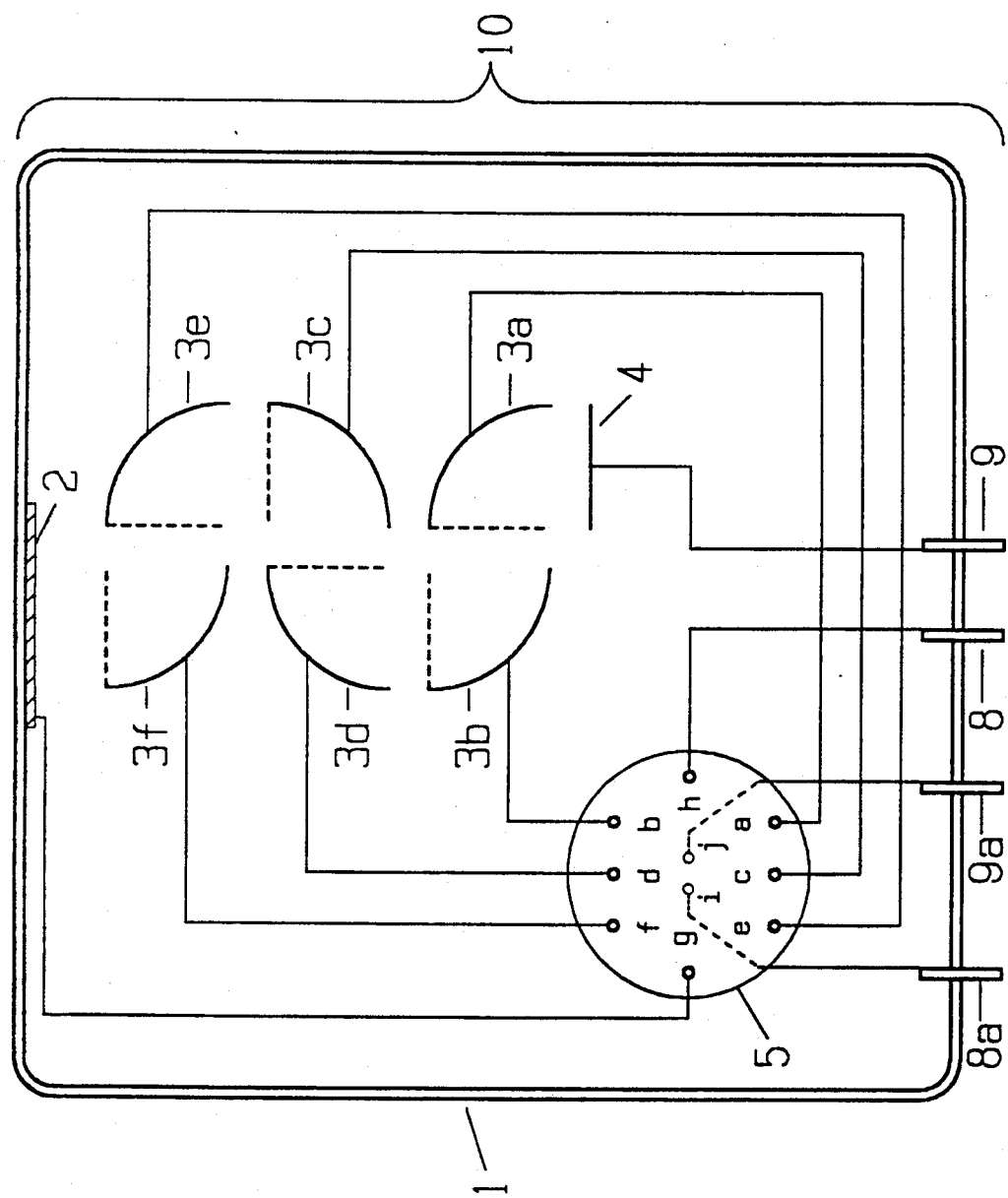
FIG. 1b is a schematic diagram of a second embodiment of the photomultiplier tube of the present invention.
Figure 2B:
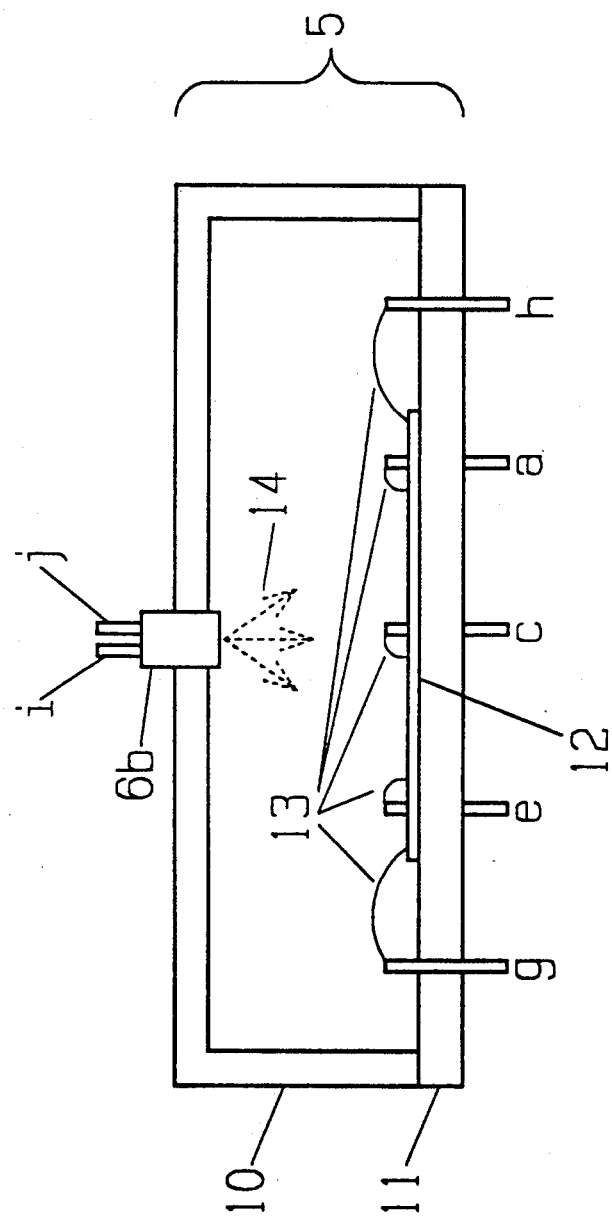
FIG. 2b is a cross-section side view through pins $g$ and $h$ of a second embodiment of the optically powered high voltage supply.

Referring to FIGS. 1b, 2b, and 3, collectively, it is also possible to provide light power 14 to photocells arrays 15a–15g by generating light within package 5. The light generating source 6b may, for example, be a light emitting diode or a laser diode. Light source 6b is electrically connected by means of lead wires i and j to electrical feedthroughs 8a and 9a in order to provide low voltage electrical power to energize light source 6b.

Referring to FIG. 3, substrate 12 supports photocell arrays 15a–15g which convert optical power to electrical power. Arrays 15a–15g are electrically connected in series. Although substrate 12 is shown to support 7 photocell arrays, it is to be understood that the scope of the invention may include any number of serially connected photocell arrays required to produce sufficient voltage for a particular application. Photocell arrays 15a–15g are connected by bonding wires 13 to electrical connection pins a–h Electrical connection pins a–h are connected to photomultiplier elements 3a–3f as previously described.

Figure 4:
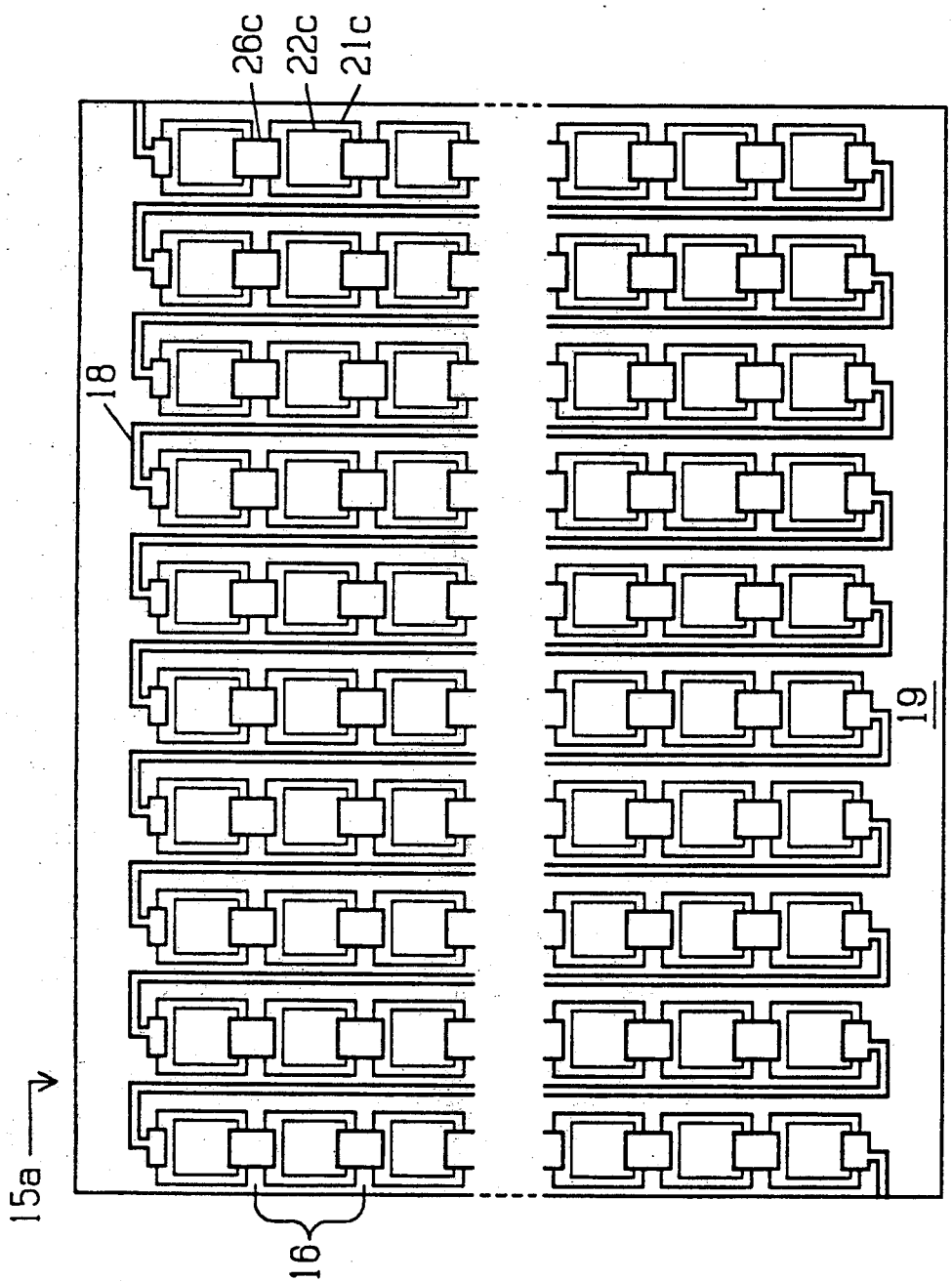
FIG. 4 is a diagram of one of the photocell circuits fabricated on the substrate.

Referring to FIG. 4, each of photocell circuits 15a–15g consists of arrays of individual photocells 16 connected in series by interconnecting lines 18 and 26c. Elements of the circuits include sapphire substrate material 19, silicon islands 21c, contact junctions 22c, and interconnecting lines 26c and 18. Typical dimensions of silicon islands 21c may be 100 micrometers by 100 micrometers. There may be any number of photocells in each of arrays 15a–15g. A photocell array suitable for use in the present invention may consist, for example, of 400 photocells connected in series. Such an array may occupy an area of about 0.1 cm$^2$ and produce an output voltage when illuminated of about 200 volts. If the optical power intensity is about 1 watt/cm$^2$, then the available current from such an array will be about 20 microamperes. The actual current required of a photocell array for a given application will depend on many variables such as the photomultiplier tube design and particular application requirements. Also, the current required by dynodes near the anode will be greater than the current required by dynodes closer to the photocathode because of the current gain which occurs in the multiplier elements. The photocell arrays can be designed to provide appropriate levels of voltage and current as required. Fabrication of circuits 15a–15g is described below.

Figure 5:
FIGS. 5-17 shows the various steps in fabrication of the photocell array.
Figure 6:
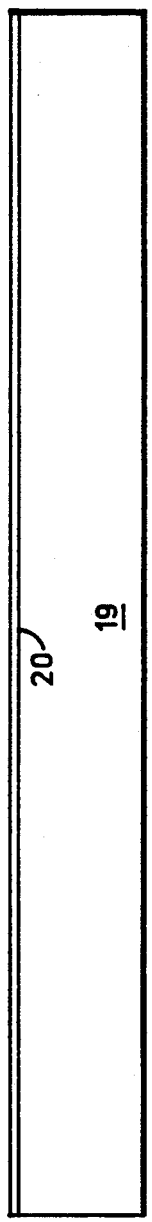
Figure 7:
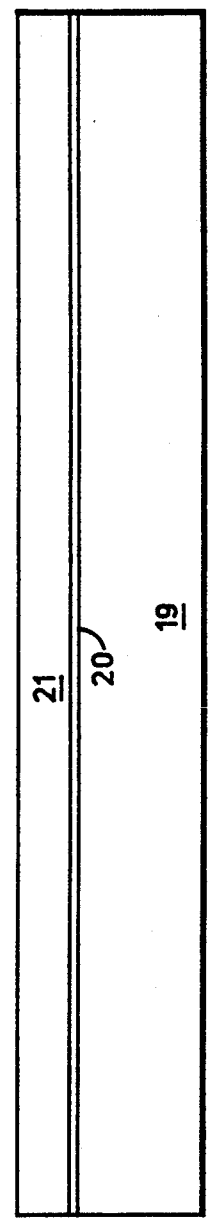

Beginning with sapphire wafer 19 (FIG. 5), a thin layer of silicon 20 is epitaxially deposited on to substrate 12 by well known methods (FIG. 6). Silicon layer 20 may have a thickness in the range of 1000 to 5000 angstroms, with a typical value of 3000 angstroms. Silicon layer 20 is made amorphous by bombardment with high energy silicon ions, then recrystallized by thermal annealing. This step is done to achieve the desired electrical properties of the silicon epitaxial layers. Layer 20 is then ion implanted with a p-type dopant such as boron to a doping level in the range of $10^{18}$ cm$^{-3}$. Referring to FIG. 7, lightly doped p-type silicon layer 21 is epitaxially grown on top of silicon layer 20. The doping level of p-type silicon layer 21 may be in the range of $10^{15}$ to $10^{16}$ cm$^{-3}$. A typical dopant is boron, and the thickness of silicon layer 20 may be in the range of 1 to 10 micrometers.

Figure 8:
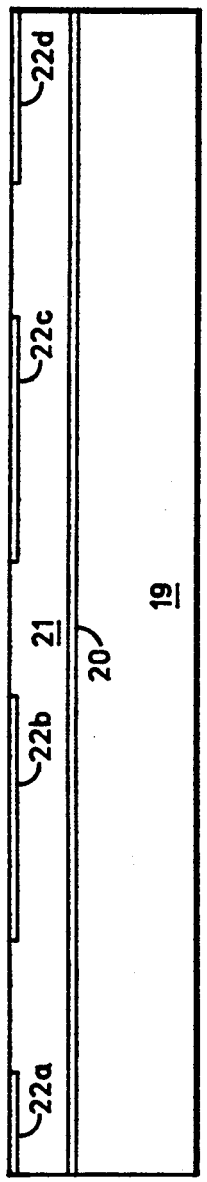

Referring to FIG. 8, top junction layers 22a–22d are formed by ion-implantation of an n-type dopant such as phosphorous to a doping level in the range of $10^{16}$ to $10^{18}$ cm$^{-3}$ into p-type silicon layer 21. Top junctions layers 22a to 22d are implanted in selected regions of p-type silicon layer 21 by the well known method of selective ion-implantation. Briefly, this consists of using optically patterned photoresist to form a implantion mask. The photoresist is removed after ion-implantation.

Figure 9:
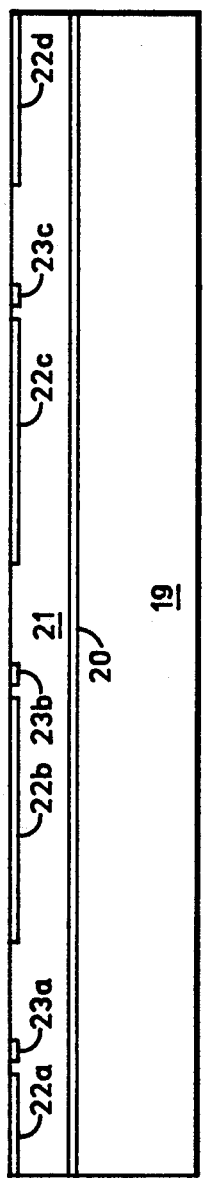

Next, referring to FIG. 9, highly doped p-type regions 23a-23c for making electrical contact to lightly doped p-type layer 21 are formed by selective ion-implantion. The doping level of regions 23a-23d may be in the range of $10^{18}$ cm$^{-3}$. Electrical activation of the ion-implanted regions of p-type silicon layer 21 is accomplished by the well known method of thermal annealing. Prior to thermal annealing, a protective layer of silicon dioxide, not shown, is deposited over the in-process wafer. The protective layer may then be removed.

Figure 10:
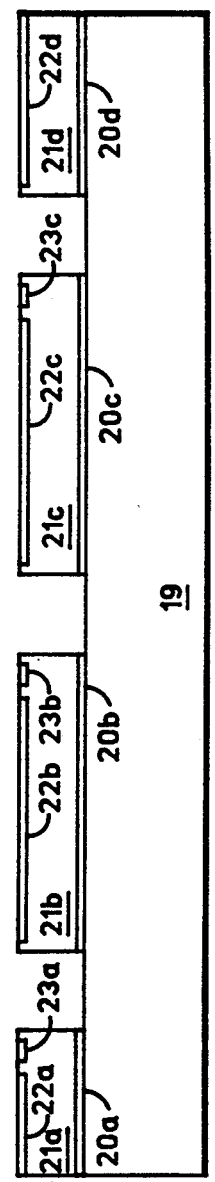

As shown in FIG. 10, silicon layers 20 and 21 are next selectively etched using well known plasma etching techniques to form isolated islands, or mesas, of silicon on sapphire substrate 19. The selective etching process is well known. It includes steps in which a photoresist mask is deposited and optically patterned.

Figure 11:
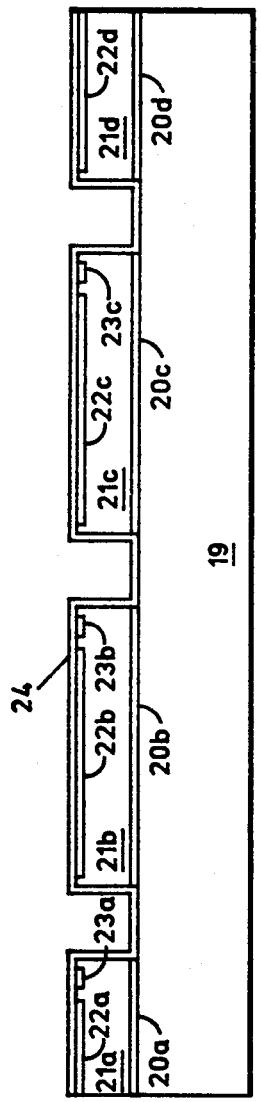
Figure 12:
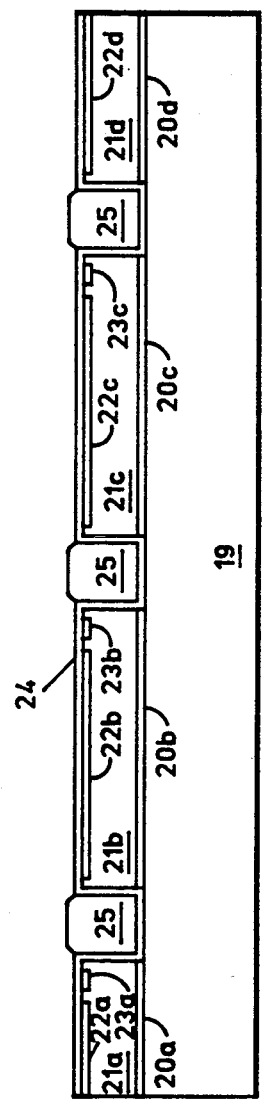

Protective silicon oxide layer 24 is deposited over the silicon mesas and sapphire substrate 19 as shown in FIG. 11. Referring to FIG. 12, planarizing layer 25 then is deposited and patterned as shown in FIG. 12. This step may be performed by depositing a layer of photosensitive polyimide which is optically patterned to obtain the result illustrated. Planarization reduces the problem of step coverage when forming interconnection layers between the silicon mesas.

Figure 13:
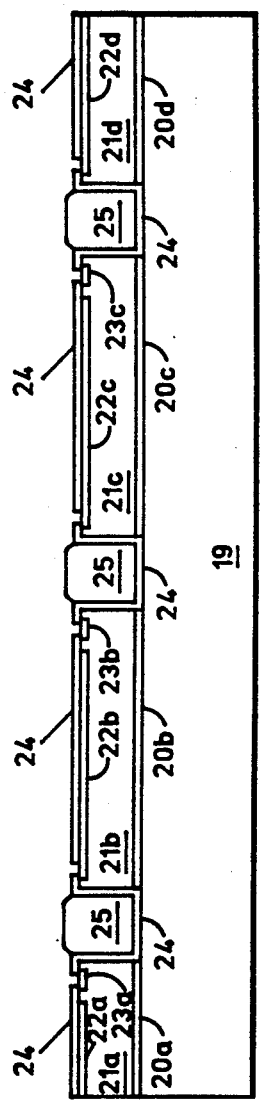

Contact holes are selectively etched in the protective oxide 24 as shown in FIG. 13. As with selective ion-implantation and selective etching of the silicon mesas, selective etching of holes in silicon oxide layers is well known.

Figure 14:
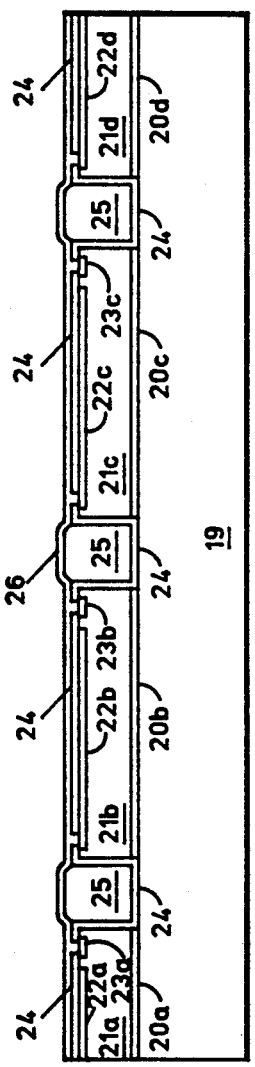
Figure 15:
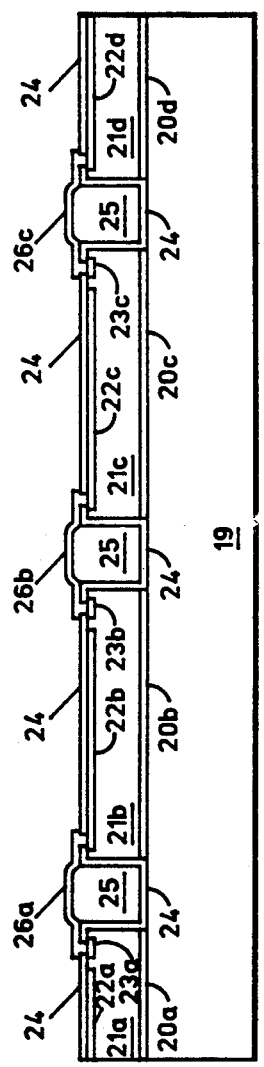
Figure 16:
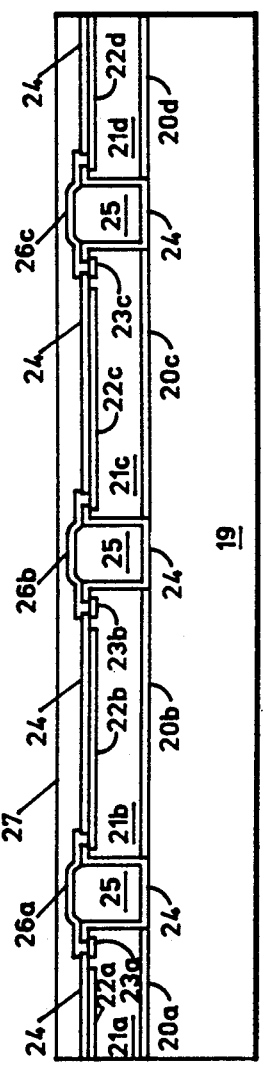

A metal layer 26 such as aluminum is deposited as shown in FIG. 14. Metal layer 26 is selectively patterned to form electrical connection from regions 23a to 22b, 23b to 22c, etc. as shown in FIG. 15.

Figure 17:
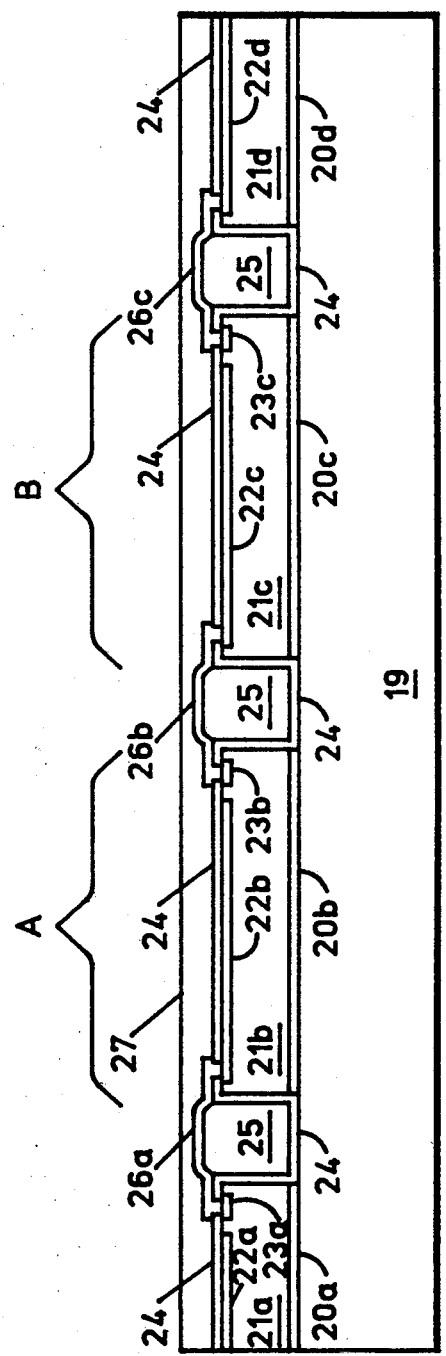

Referring to FIG. 17, protective silicon oxide layer 27 is formed over the entire wafer. Holes in protective oxide layer 27 are formed over large metal areas, not shown, for the purpose of providing contact areas for bond wires 13 of FIGS. 2a, 2b, and 3.

Photocell array, shown in cross-section in FIG. 17 includes sapphire substrate 19, heavily p-type layers 20a-20d, lightly p-type layers 21a-21d, n-type layers 22a-22d, heavily p-type layers 23a-23d, protective silicon oxide layer 24, planarizing layer 25, metal interconnection layers 26a-26d, and protective silicon oxide layer 27. Photocell mesa B may include, for example, the patterned silicon region with layers 20b, 21b, 22b, and 23b. Photocell mesa B is connected to photocell mesa C by metal layer 26b. Arrays of photocell mesas with up to thousands of photocells 16 are fabricated as illustrated in part, by way of example, in FIG. 4.

The photocell array fabricated with the above-referenced techniques is particularly well suited for employment in the present invention because it provides very high voltage with optimized efficiency. When excited by optical power, an individual photocell mesa will produce up to approximately 0.5 V of electrical potential. A photocell with lateral dimensions of 100 by 100 micrometers will produce an output electrical current up to approximately 20 microamperes when illuminated by 1 watt cm$^{-2}$ of optical power with a wavelength of about 0.8 micrometers. This corresponds to a conversion efficiency of optical to electrical power of about 10 per cent. The voltage outputs for each of the arrays 15a-15g would be from about 100 to 500 volts with current capacities in the range of about 1-100 microamperes. Substrate 12 is typically about 1 cm$^2$ in area. The optical power provided by fiber 6 is about 1 watt with a wavelength of approximately 0.8 micrometer.

An alternative method for producing photocell arrays 15a-15g would be to follow the fabrication steps outlined above, but to substitute n-type doping in the layers which are specified as p-type, and p-type doping in the layers which are specified as n-type. The polarity of the electrical output will be reversed, but comparable performance would otherwise be expected.

Obviously, many modifications and variations of the present invention are possible in light of the above teachings. It is therefore to be understood that within the scope of the appended claims, the invention may be practiced otherwise than as specifically described.

We claim:

1. an optically powered photomultiplier tube, comprising:

a photomultiplier tube having an electron multiplier; and a series connection of a plurality of photovoltaic power cells mounted within said photomultiplier tube and operably coupled to said electron multiplier for providing electrical bias power to said electron multiplier.

2. The optically powered photomultiplier tube of claim 1 wherein:

said photovoltaic power cells are fabricated with epitaxial silicon-on-sapphire.

3. An optically powered photomultiplier tube, comprising:

a vacuum chamber having an incident window;

a photocathode positioned within said chamber for emitting an electron current;

electron multiplier means positioned within said vacuum chamber for amplifying said electron current;

an anode positioned within said container to receive said amplified electron current;

a photocell array positioned within said vacuum chamber for generating electrical bias power which is provided to said electron multiplier means;

means operably coupled to said photocell array for conveying optical power to said photocell array;

a first electrical contact penetrating said vacuum chamber in a vacuum tight manner and operably coupled to said anode; and a second electrical contact penetrating said vacuum chamber in a vacuum tight manner and operably coupled to said photocell array.

4. The optically powered photomultiplier tube of claim 3 further including:

means operatively coupled to said optical power conveying means for generating light energy.

5. The optically powered photomultiplier tube of claim 4 wherein:

said optical power conveying means includes an optic fiber operably coupled between said light energy generating means and said photocell array.

6. The optically powered photomultiplier tube of claim 4 wherein:

said light energy generating means is mounted within said vacuum chamber.

7. The optically powered photomultiplier tube of claim 4 wherein:

said light energy generating means includes a laser diode for providing light energy to said photocell array.

8. The optically powered photomultiplier tube of claim 5 wherein:
said light energy generating means includes a laser diode for providing light energy to said photocell array.

9. The optically powered photomultiplier tube of claim 6 wherein:
said light energy generating means includes a laser diode for providing light energy to said photocell array.

10. The optically powered photomultiplier tube of claim 4 wherein:
said light energy generating means includes a light emitting diode for providing light energy to said photocell array.

11. The optically powered photomultiplier tube of claim 5 wherein:
said light energy generating means includes a light emitting diode for providing light energy to said photocell array.

12. The optically powered photomultiplier tube of claim 6 wherein:
said light energy generating means includes a light emitting diode for providing light energy to said photocell array.

13. The optically powered photomultiplier tube of claims 3, 4, 5, 6, 7, 8, 9, 10, 11, or 12 wherein:
said photocell array is fabricated with epitaxial silicon-on-sapphire.

* * * * *